US011719751B2

(12) United States Patent
Gabrielsson

(10) Patent No.: US 11,719,751 B2
(45) Date of Patent: Aug. 8, 2023

(54) RELAY STATUS DETECTION SYSTEM

(71) Applicant: Webasto Charging Systems, Inc., Monrovia, CA (US)

(72) Inventor: Peter Gabrielsson, Monrovia, CA (US)

(73) Assignee: WEBASTO CHARGING SYSTEMS, INC., Monrovia, CA (US)

(\*) Notice: Subject to any disclaimer, the term of this patent is extended or adjusted under 35 U.S.C. 154(b) by 17 days.

(21) Appl. No.: 17/397,840

(22) Filed: Aug. 9, 2021

(65) Prior Publication Data
US 2023/0044927 A1    Feb. 9, 2023

(51) Int. Cl.
| G01R 31/00 | (2006.01) |
| G01R 31/327 | (2006.01) |
| B60L 3/00 | (2019.01) |
| H01H 47/00 | (2006.01) |

(52) U.S. Cl.
CPC ........ G01R 31/3278 (2013.01); B60L 3/0038 (2013.01); H01H 47/002 (2013.01); *H01H 2231/026* (2013.01)

(58) Field of Classification Search
USPC .................................................. 324/418–424
See application file for complete search history.

(56) References Cited

U.S. PATENT DOCUMENTS

| 5,907,267 | A | 5/1999 | Reid et al. | |
| 2006/0089050 | A1* | 4/2006 | Smith | H01H 9/10 |
| | | | | 439/620.29 |
| 2007/0108845 | A1* | 5/2007 | Crane | H01H 9/542 |
| | | | | 307/116 |
| 2018/0061599 | A1 | 3/2018 | Enomoto et al. | |
| 2020/0365338 | A1* | 11/2020 | Rushabh | H01H 50/546 |

FOREIGN PATENT DOCUMENTS

| DE | 19547524 C1 | 11/1996 |
| DE | 19960399 | 9/2004 |
| EP | 2960923 A1 | 12/2015 |

OTHER PUBLICATIONS

International Search Report and Written Opinion for PCT/US22/39179, dated Nov. 15, 2022.

\* cited by examiner

*Primary Examiner* — Vincent Q Nguyen
(74) *Attorney, Agent, or Firm* — Concept IP LLP; Michael Zarrabian

(57) ABSTRACT

Systems, devices, and methods including: a relay, the relay including: at least one contact; a reflector attached to at least one contact; a sensor, the sensor including: an emitter configured to emit a pulse; a detector configured to receive a portion of the emitted pulse; where the reflector may be configured to reflect at least a portion of the emitted pulse to be received by the detector when the at least one contact may be in at least one of: an open position and a closed position.

20 Claims, 11 Drawing Sheets

RELAY STATUS DETECTION SYSTEM

TECHNICAL FIELD

Embodiments relate generally to relays, and more particularly to relay status detection.

BACKGROUND

Rules and laws may require checking relays in electric vehicle supply equipment (EVSE) for proper operation. Due to the high voltages used in EVSE operation, equipment used to verify the operation of these relays may need to be able to sustain high voltages themselves. In some cases, this can require the use of one or more components capable of withstanding high voltages. This can lead to increased cost and complexity in order to ensure proper operation of electrical relays.

SUMMARY

A system embodiment may include: a relay, the relay comprising: at least one contact; a reflector attached to at least one contact; a sensor, the sensor comprising: an emitter configured to emit a pulse; a detector configured to receive a portion of the emitted pulse; where the reflector may be configured to reflect at least a portion of the emitted pulse to be received by the detector when the at least one contact may be in at least one of: an open position and a closed position.

In additional system embodiments, the relay further comprises a housing. In additional system embodiments, the relay housing further comprises a window. In additional system embodiments, the window may be disposed proximate the reflector when the at least one contact may be in at least one of: the open position and the closed position. In additional system embodiments, the emitted pulse may be configured to be received through the window and into an interior of the housing such that the emitted pulse may not be received by the detector when the at least one contact may be in at least one of: the open position and the closed position.

In additional system embodiments, the relay may be a normally open relay. In additional system embodiments, the relay may be a normally closed relay.

Additional system embodiments may include: a microcontroller in communication with the relay and the sensor. In additional system embodiments, the microcontroller may be configured to: send a relay signal to the relay to at least one of: switch on and switch off. In additional system embodiments, the microcontroller may be configured to: send a status check signal to the sensor to determine a status of the relay. In additional system embodiments, the microcontroller may be configured to: receive a status signal from the sensor based on the sent status check signal, where the status signal may be based whether the detector received a portion of the emitted pulse. In additional system embodiments, the microcontroller may be configured to: determine whether the relay has a fault condition based on the sent relay signal and the received status signal.

A method embodiment may include: attaching a reflector to a first contact of two contacts of a relay; creating a window proximate the attached reflector in a housing of the relay; placing a sensor proximate the created window for detecting a state of the relay.

In additional method embodiments, the window may be created proximate the reflector in an open position of the relay. In additional method embodiments, the window may be created proximate the reflector in a closed position of the relay.

Another method embodiment may include: emitting, by an emitter of a sensor, a pulse; and receiving at least a portion of the emitted pulse through a window in a housing of a relay; where at least a portion of the emitted pulse may be reflected by a reflector attached to a contact of the relay and received by a detector of the sensor if the reflector may be disposed proximate the window in the housing of the relay.

In additional method embodiments, at least a portion of the emitted pulse may be not received by a detector of the sensor if the reflector may be disposed distal from the window in the housing of the relay.

Additional method embodiments may include: sending, by a microcontroller, a relay signal to the relay to at least one of: switch on and switch off; and sending, by the microcontroller, a status check signal to the sensor. Additional method embodiments may include: receiving, by the microcontroller, a status signal based on whether the portion of the reflected pulse was received by the detector of the sensor.

Additional method embodiments may include: determining, by the microcontroller, whether the relay has a fault condition based on the sent relay signal and the received status signal.

BRIEF DESCRIPTION OF THE DRAWINGS

The components in the figures are not necessarily to scale, emphasis instead being placed upon illustrating the principals of the invention. Like reference numerals designate corresponding parts throughout the different views. Embodiments are illustrated by way of example and not limitation in the figures of the accompanying drawings, in which.

DETAILED DESCRIPTION

The present system and method allows for the detection of a status of a relay, such a relay used in an electrical charging system. The present system can indicate whether the relays is operating correctly. The present system can also indicate when there is a fault condition, such as when contacts of a relay are welded together. A reflector may be added onto one of the relay contacts to reflect a signal from an emitter. A detector may receive the signal from the emitter that was reflected from the reflector in order to determine the status of the relay.

Figure 1:
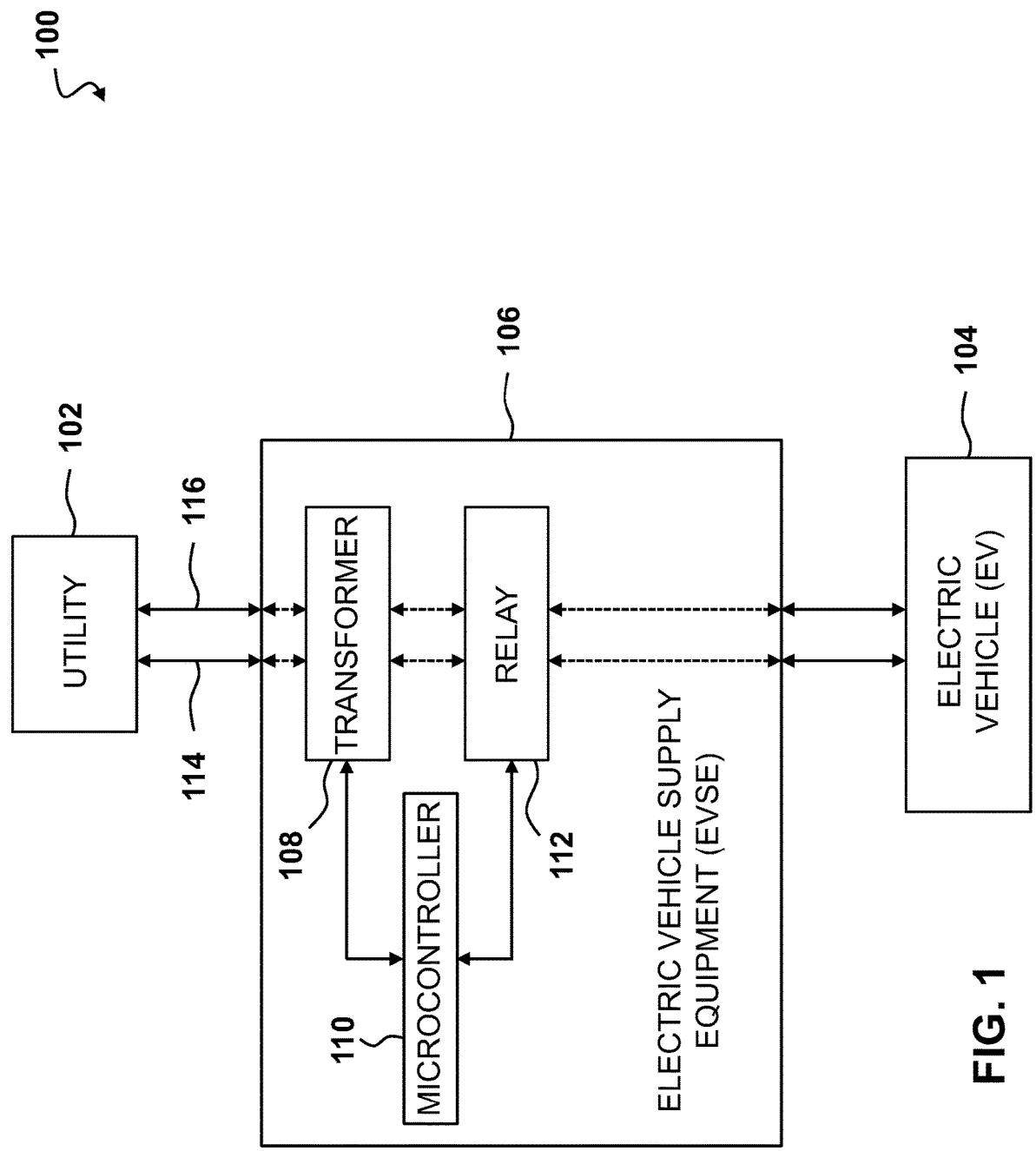
FIG. 1 depicts an exemplary system for cutting power between a utility and an electric vehicle if a fault is detected, according to one embodiment.

FIG. 1 depicts an exemplary system 100 for cutting power between a utility 102 and an electric vehicle (EV) 104 if a fault is detected. The system may include an electric vehicle supply equipment (EVSE) 106 to charge the EV 104 with power provided by the utility 102. While this system is described with reference to an EVSE, it may be applied to other electrical systems, such as a wall socket in a building. The EVSE 106 may include a current sensing transformer 108. One or more utility lines 114, 116, depicted as solid lines and dashed lines in the EVSE 106, may connect to the transformer 108.

A microcontroller 110 may be in communication with the transformer. The microcontroller 110 may determine if a fault event occurs. In some embodiments, the fault event may be a leakage current fault, temperature fault, or other faults. The vehicle or user may also command the EVSE to end the charge session for any reason. The microcontroller 110 may send a signal to a relay 112 and/or to the transformer 108 to cut power between the EVSE 106 and/or the EV 104 and the utility 102 when the fault event occurs. While a microcontroller 110 is depicted in the system 100, one or all of its functions may be replaced by analog and logic circuitry in some embodiments as disclosed herein. Likewise, additional microcontrollers may be used to accomplish different functions.

Figure 2:
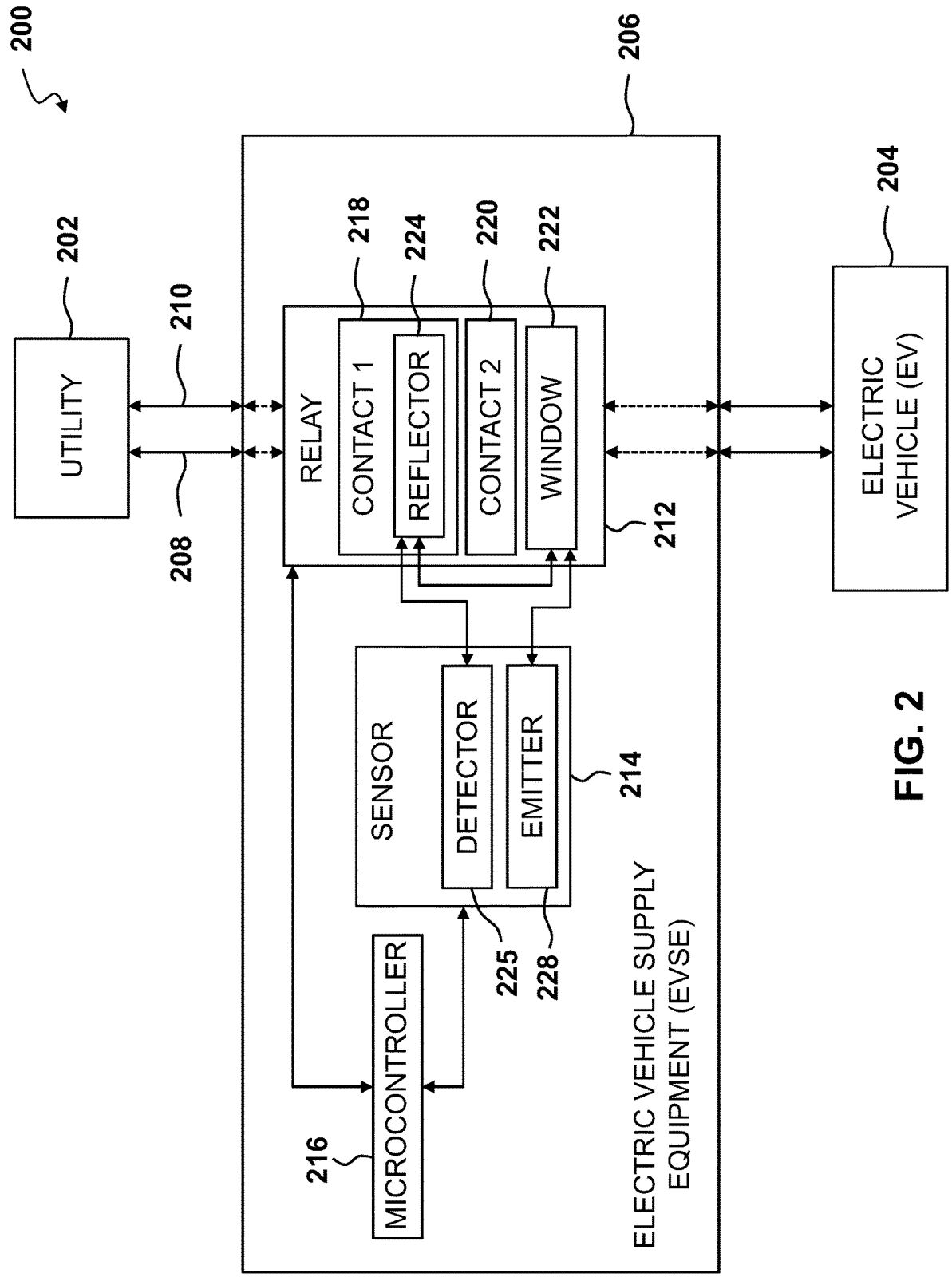
FIG. 2 depicts a block diagram of a system for detecting a status of a relay, according to one embodiment.

FIG. 2 depicts a block diagram of a system 200 for detecting a status of a relay 212, according to one embodiment. The system 200 may include an electric vehicle supply equipment (EVSE) 206 to charge the EV 204 with power provided by the utility 202. While this system is described with reference to an EVSE, it may be applied to other electrical systems, such as a wall socket in a building. The EVSE 206 may include a relay 212, a sensor 214, and a microcontroller 216. In some embodiments, the sensor 214 may be an optical sensor. One or more utility lines 208, 210, depicted as solid lines and dashed lines in the EVSE 206, may connect to the transformer relay 212.

The relay 212 may include one or more contacts, such as a first contact 218 and a second contact 220. In some embodiment, there may be more than two contacts. In some embodiments, the system and method disclosed herein may be applied to multipole relays. In embodiments with more than two contacts or positions there may be two or more detectors with one detector for each position of the switch. The relay 212 may have a reflector 224 connected to a first contact 218. The reflector 224 may be any material that reflects light, waves, and/or energy. In some embodiments, the reflector 224 may be made from metal, plastic, glass, or any material that reflects light. In some embodiments, the reflector 224 may be made from copper. The reflector 224 may be attached to the contact via an adhesive, solder, welding, or the like. In some embodiments, the reflector 224 may be formed as part of the contact spring. In some embodiments, the reflector may be attached to a moveable portion of the relay 212, such as an armature (306, FIG. 3A) of the relay or the contact spring. Placing the reflector 224 proximate the first contact 218 may allow for maximum movement as compared to a placement of the reflector 224 closer to a hinge. The relay 212 may also include a window 222, which is an opening in a housing of the relay 212. In some embodiments, the window 222 may be positioned proximate a location of the reflector in an open position of the relay 212. In other embodiments, the window 222 may be positioned proximate a location of the reflector in a closed position of the relay 212.

The sensor 214 may be disposed proximate the window 212 of the relay 212. The sensor 214 may include an emitter 228. In some embodiments, the emitter 228 may be a light emitting diode (LED). In some embodiments, the emitter 228 may use any electromagnetic radiation of an appropriate frequency. In some embodiments, the emitter 228 may use ultrasound, ultraviolet (UAV), infrared (IR), X-rays, radio frequency (RF), lasers, or the like. The emitter 228 may be configured to emit a pulse or continuous stream toward the window 222 of the relay 212. The sensor 214 may also include a detector 226. In some embodiments, the detector 226 may be any detector matching the emitter 228 frequency and medium. In some embodiments, the detector 226 may be an antenna, optical detector, RF detector, laser detector, or the like. The detector 226 may be configured to detect the pulse from the emitter 228 that has been reflected by the reflector 224 of the relay 212 when the reflector 224 is positioned in the window 222 of the relay. When the reflector 224 is not positioned in the window 222 of the relay then the detector may not detect any light, waves, and/or energy. The presence, or absence, of the reflected pulse or continuous stream at the detector 226 may be used to determine a status of the relay as either open, i.e., the contacts 218, 220 are apart and not electrically connected, or closed, i.e., the contacts 218, 220 are together and electrically connected.

The microcontroller 216 may be in communication with the relay 212 and the sensor 214. The microcontroller 216 may send a relay signal to the relay 212 to switch on and/or switch off. The microcontroller 216 may send a status check signal to the sensor 214 to determine if the relay 212 is operating correctly or if the relay has a fault condition, e.g., if the contacts 218, 220 have been welded together and a relay signal to switch off does not result in the relay 212 switching off. While a microcontroller 216 is depicted in the system 200, one or all of its functions may be replaced by analog and logic circuitry in some embodiments as disclosed herein. In some embodiments, the sensor (214) may continuously check the status of the relay (212) to detect any fault conditions. In some embodiments, the sensor (214) checks the status of the relay (212) at a set interval to detect any fault conditions. In some embodiments, the sensor (214) may only check the status of the relay (212) when the relay is expected to change state, such as when a new relay signal is sent to the relay to switch from on to off. In some embodiments, the detector may check the relay continuously. In other embodiments, the detector may check the relay periodically at regular predetermined intervals. In one embodiment, the detector may check the relay status at 1 Hz. In some applications, the detector may check on the relay status only on a relay state change, such as when a signal is sent to switch on from a switch off state.

Figure 3A:
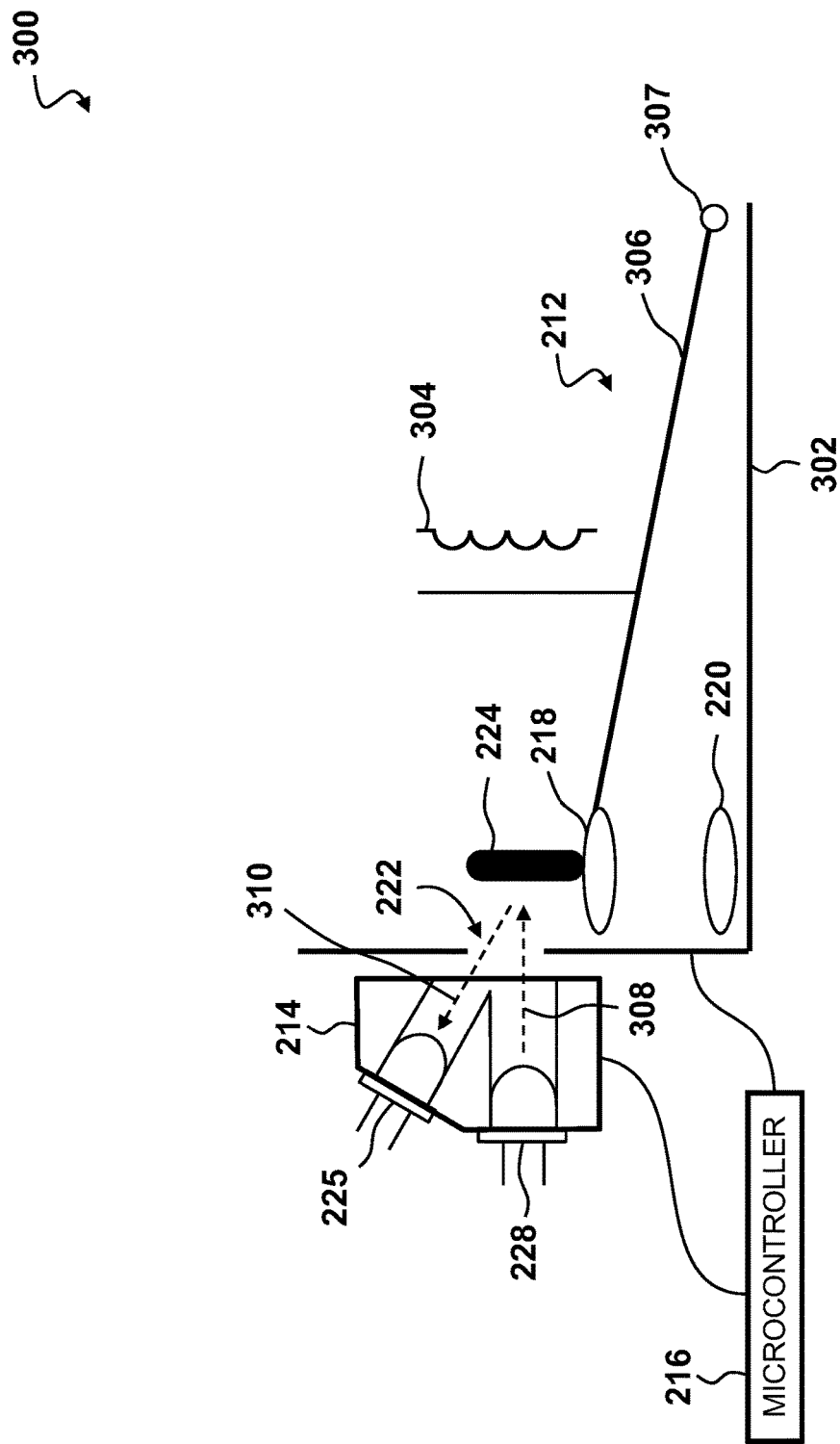
FIG. 3A depicts an open position of contacts in the relay in the system of FIG. 2, according to one embodiment.

FIG. 3A depicts an open position 300 of contacts 218, 220 in the relay 212 in the system of FIG. 2, according to one embodiment. The window 222 is disposed in a housing 302 of the relay 212. In some embodiments, the window 222 may be an aperture cut into or formed into the housing 302 of the relay 212. The window 222 may be any size or shape needed to allow emitted 308 light from the emitter 228 past the window 222 to be reflected by the reflector 224 or to continue into an interior of the housing, as in FIG. 3B.

When the reflector 224 is disposed proximate the window 222, such as when the contacts 218, 220 are in an open position, the emitted light, wave, or other energy 308 from the emitter 228 is reflected off of the reflector and this light, wave, or other energy is received 310 by the detector 225. In some embodiments, the light, wave, or other energy may be a pulse. In some embodiments, the light, wave, or other energy may be a continuous light. The first contact 218 may be connected to an armature 306 connected to a hinge 307 that may be actuated by a relay coil 304.

Figure 3B:
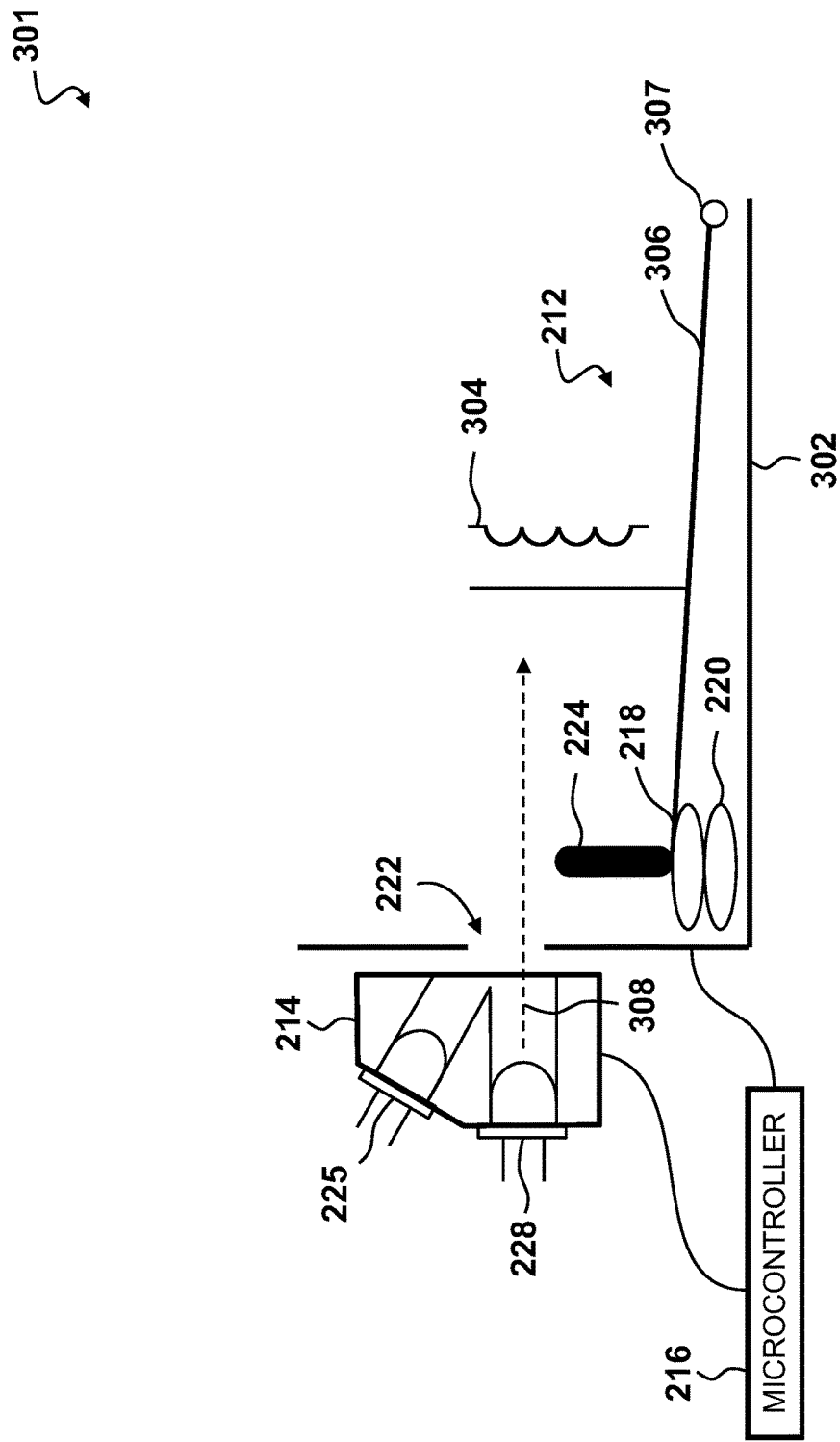
FIG. 3B depict a closed position of contacts in the relay in the system of FIG. 2, according to one embodiment.

FIG. 3B depict a closed position 301 of contacts 218, 220 in the relay 212 in the system of FIG. 2, according to one embodiment. The armature 306 may be actuated to move the first contact 218 to make electrical contact with the second contact 220. In this closed position 301, the reflector 224 is not disposed proximate the window 222 of the relay 212. Any light, wave, or other energy emitted 308 from the emitter 228 will enter an interior of the housing 302 of the relay 212 and not be received by the detector 225. The relay 212 may be a normally open relay in some embodiments. The relay 212 may be a normally closed relay in other embodiments. The microcontroller 216 may be in contact with the sensor 214 and/or the relay 212 in order to send and/or receive signals therebetween. While a microcontroller 216 is depicted, one or all of its functions may be replaced by analog and logic circuitry in some embodiments as disclosed herein.

Figure 4:
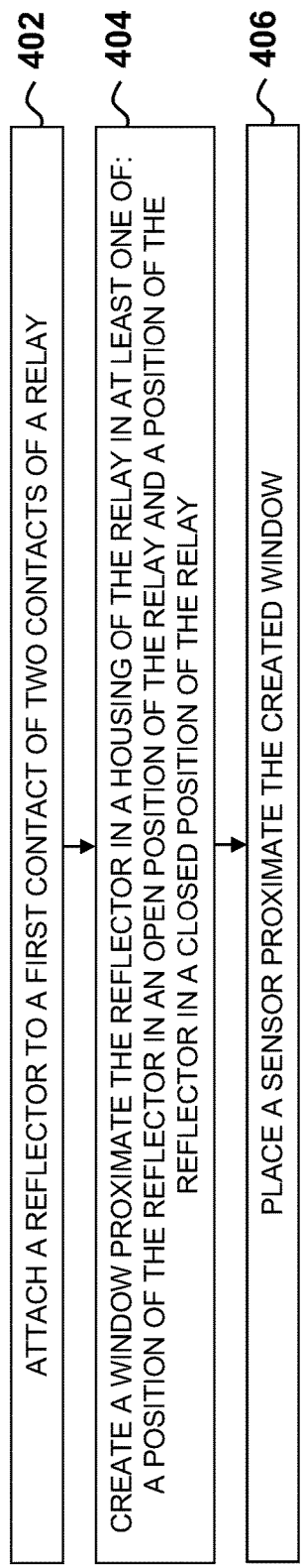
FIG. 4 depicts a flow chart of a method embodiment of assembling an electric vehicle supply equipment (EVSE) for detecting a status of a relay, according to one embodiment.

FIG. 4 depicts a flow chart of a method embodiment 400 of assembling an electric vehicle supply equipment (EVSE) for detecting a status of a relay, according to one embodiment. The method 400 may include attaching a reflector to a first contact of two contacts of a relay (step 402). In some embodiments, the relay may include more than two contacts. In some embodiments, the reflector may be attached to another moveable portion of the relay. The reflector may be attached to the relay via an adhesive, soldering, welding, or the like. The method 400 may then include creating a window proximate the reflector in a housing of the relay in at least one of: a position of the reflector in an open position of the relay and a position of the reflector in a closed position of the relay (step 404). In embodiments with more than two contacts two or more detectors may be utilized such that a detector is present at each contact position. The method 400 may then include placing a sensor proximate the created window (406). In some embodiments, the sensor may be an optical sensor. The sensor may be placed such that a pulse, energy, or other wave from an emitter of the sensor is aligned to travel through the window in the relay housing. In some embodiments, the pulse may instead be a continuous light stream, energy stream, or other stream of waves. The emitter may emit any electromagnetic radiation of an appropriate frequency. In some embodiments, the emitter 228 may use ultrasound, ultraviolet (UAV), infrared (IR), X-rays, radio frequency (RF), lasers, or the like. If the reflector is positioned in the window, as in FIG. 3A, then a portion of the beam of light, energy, or waves will be reflected by the reflector and reach a detector of the sensor. If the reflector is not positioned in the window, as in FIG. 3B, then the beam of light, energy, or waves will continue inside the housing of the relay, not be reflected by the reflector, and not reach a detector of the sensor.

Figure 5:
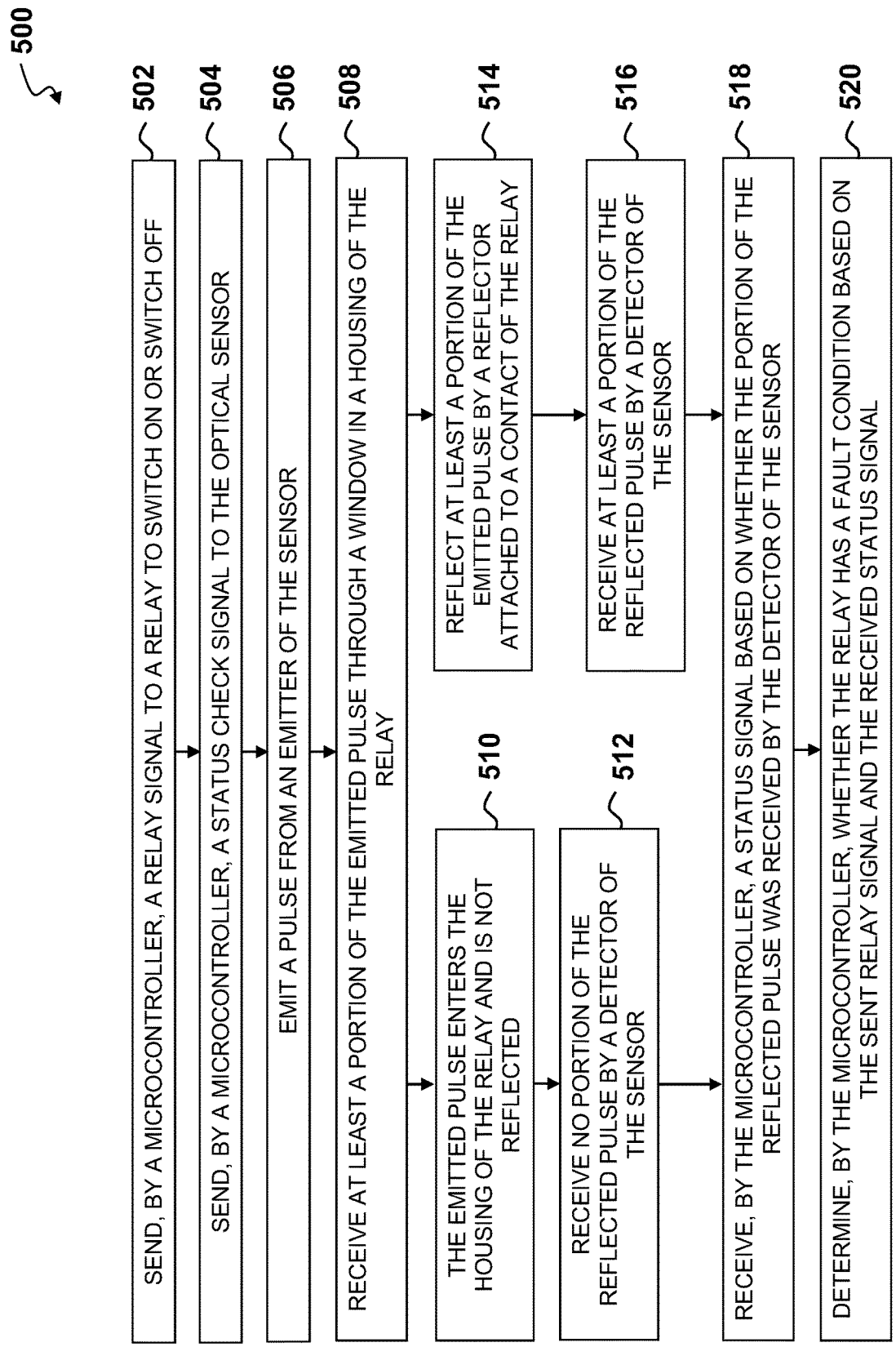
FIG. 5 depicts a flow chart of a method embodiment of detecting a status of a relay, according to one embodiment.

FIG. 5 depicts a flow chart of a method embodiment 500 of detecting a status of a relay, according to one embodiment. The method 500 may include sending, by a microcontroller, a relay signal to a relay to switch on or switch off (step 502). The method 500 may then include sending, by a microcontroller, a status check signal to the sensor (step 504). The method 500 may then include emitting a pulse from an emitter of the sensor (step 506). The pulse may be a pulse of light in some embodiments. In other embodiments, the pulse may be a continuous stream. The emitter may use any electromagnetic radiation of an appropriate frequency. In some embodiments, the emitter may use ultrasound, ultraviolet (UAV), infrared (IR), X-rays, radio frequency (RF), lasers, or the like. The method 500 may then include receiving at least a portion of the emitted pulse through a window in a housing of the relay (step 506).

If the reflector is not positioned in the window of the housing, the method 500 may then include the emitted pulse entering the housing of the relay and not being reflected by the reflector (step 510). As a result, the detector of the sensor receives no portion of the reflected pulse (step 512). The detector may use any electromagnetic radiation of an appropriate frequency. In some embodiments, the detector may use ultrasound, ultraviolet (UAV), infrared (IR), X-rays, radio frequency (RF), lasers, or the like.

If the reflector is not positioned in the window of the housing, the method 500 may then include reflecting at least a portion of the emitted pulse by a reflector attached to a contact of the relay (step 514). As a result, a detector of the sensor receives at least a portion of the reflected pulse (step 516).

The method 500 may then include receiving, by the microcontroller, a status signal based on whether the portion of the reflected pulse was received by the detector of the sensor (step 518). The method 500 may then include determining, by the microcontroller, whether the relay has a fault condition based on the sent relay signal and the received status signal. While a microcontroller is depicted in the method 500, one or all of its functions may be replaced by analog and logic circuitry in some embodiments as disclosed herein.

Figure 6B:
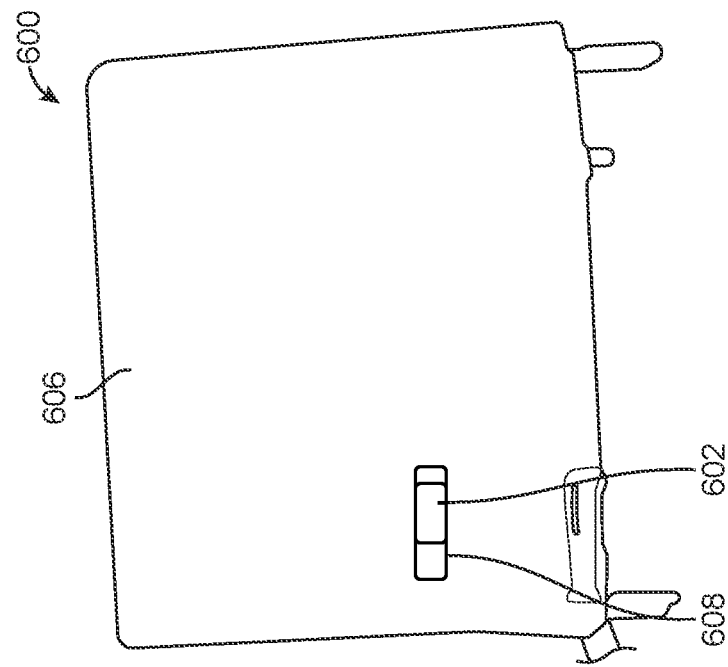
FIG. 6B depicts the relay of FIG. 6A with the housing replaced and a window added to the housing, according to one embodiment.
Figure 6A:
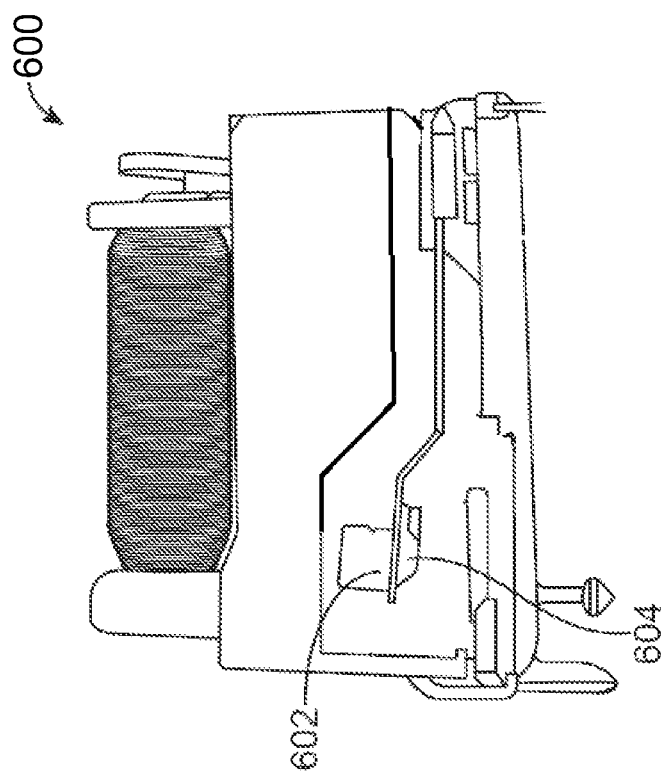
FIG. 6A depicts a relay having a reflector attached to a contact and a housing removed, according to one embodiment.

FIG. 6A depicts a relay 600 having a reflector 602 attached to a contact and a housing removed, according to one embodiment.

FIG. 6B depicts the relay 600 of FIG. 6A with the housing 606 replaced and a window 608 added to the housing 606, according to one embodiment. A portion of the reflector 602 is visible through the window 608 in the housing 606. In some embodiments, the window 608 may be sized about the same size as the reflector 602 so as to allow light, energy, or waves to be reflected and detected and to prevent light, waves, or other energy from bleeding in from outside the system in some circumstances.

Figure 7:
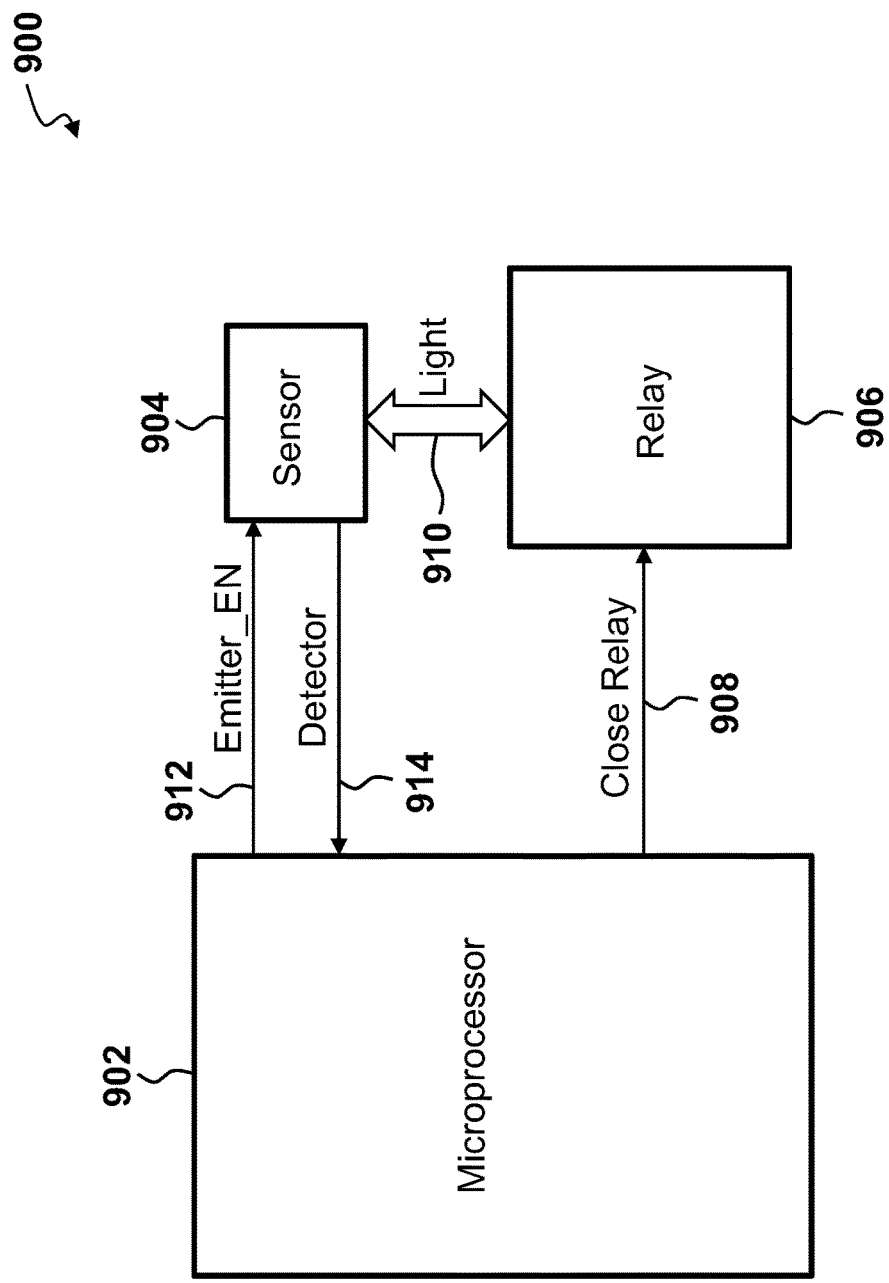
FIG. 7 depicts a block diagram of another system for detecting a status of a relay, according to one embodiment.

FIG. 7 depicts a block diagram of another system 900 for detecting a status of a relay, according to one embodiment. The system 900 may include a microprocessor 902, a sensor 904, and a relay 906. The microprocessor 902 may send a signal 908 to the relay 906, such as to close the relay 906 or open the relay 906. The sensor 904 may output a light, energy, or wave 910 to detect a status of the relay 906. If the light, energy, or wave 910 output by the sensor 904 is not reflected back to the sensor 904, then the relay 906 may be closed. If the light, energy, or wave 910 output by the sensor 904 is reflected back to the sensor 904, then the relay 906 may be open. The light, energy, or wave 910 may be reflected back to the sensor 904 by a reflective element attached to a contact, armature, or other moveable element of the relay 906. The relay 906 may have a hole, aperture, or opening in its housing to allow light, energy, or waves 910 to pass through and/or be reflected back to the sensor 904. The microprocessor 902 may also send a sensor signal 912 to the sensor. The sensor 904 may send a detector signal 914 back to the microprocessor 902. The detector signal 914 may indicate whether there is a fault in the relay 906 or whether the relay 906 is operating correctly. For example, the relay 906 may be operating correctly when a sign 908 to close the relay 906 is received by the relay 906, the relay closes, the sensor 904 detects via the light, energy, or waves 904 that the relay 906 has been closed, and the sensor sends a detector signal 914 to the microprocessor 902 confirming that the relay 906 has been closed as instructed in the signal 908. While a microprocessor 902 is depicted in the system 900, one or all of its functions may be replaced by analog and logic circuitry in some embodiments as disclosed herein.

Figure 8:
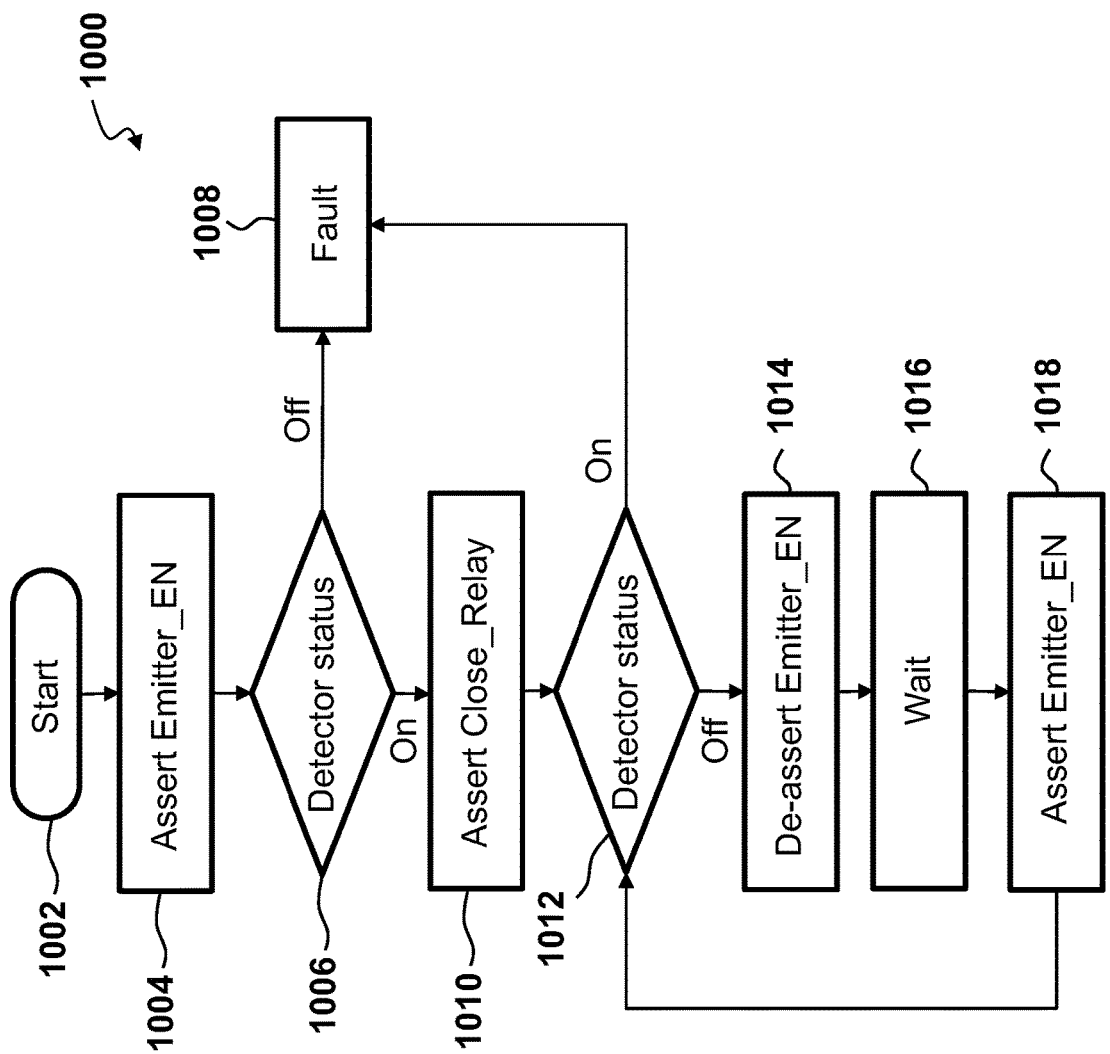
FIG. 8 depicts a flow chart of another system for detecting a status of a relay, according to one embodiment.

FIG. 8 depicts a flow chart of another system 1000 for detecting a status of a relay, according to one embodiment. The system 1000 may have a start 1002. The system 1000 may send an Emitter_EN signal 1004 to a sensor. The Emitter_EN signal is a signal to turn on or enable an emitter. The detector status 1006 of the sensor may determine if there is a fault 1008. If there is not a fault, a microprocessor may send an assert close relay 1010 signal to the relay. The detector status 1012 may once again check the status of the relay via the sensor to determine if there is a fault 1008. If there is not a fault 1008, the microprocessor may send a de-assert Emitter_EN 1014 signal to the sensor. The de-assert Emitter_EN signal is a signal to turn off or disable the emitter. The system may then wait 1016. The microprocessor may then send a new assert emitter_EN 1018 signal to the sensor.

Figure 9:
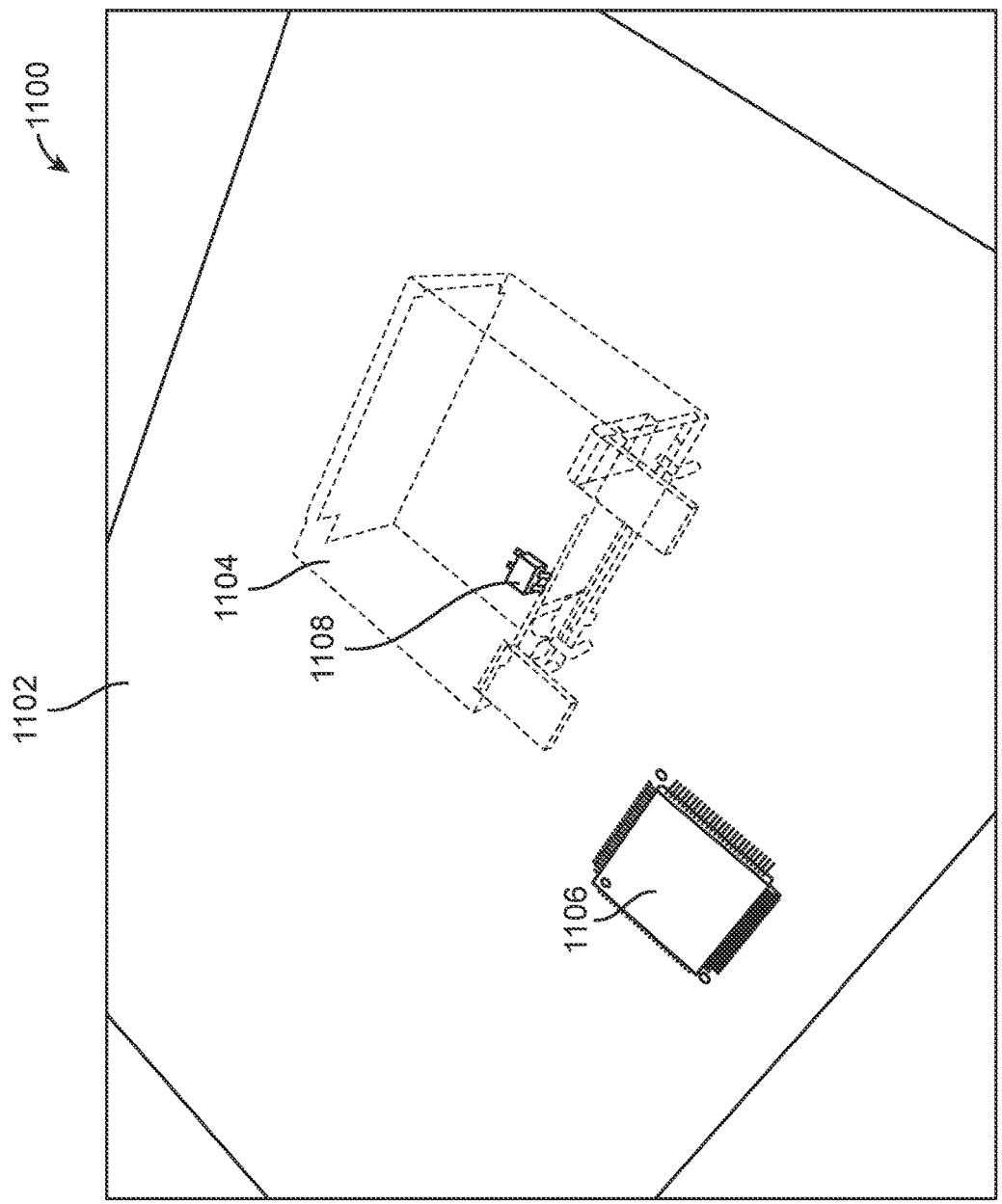
FIG. 9 depicts a perspective view of a sensor mounted on a circuit board under a partially transparent horizontal relay, according to one embodiment.

FIG. 9 depicts a perspective view 1100 of a sensor 1108 mounted on a circuit board 1102 under a partially transparent horizontal relay 1104, according to one embodiment. The sensor 1108, such as an optical sensor, may be mounted directly to a circuit board 1102, such as a printed circuit board (PCB). The horizontal relay 1104 may be connected to the circuit board 1102 and placed on top of the sensor 1108 such that the sensor 1108 is aligned relative to the horizontal relay 1104 to detect a state of the horizontal relay 1104. A microprocessor 1106 may also be mounted to the circuit board 1102 and in communication with the horizontal relay 1104 and the sensor 1108.

Figure 10:
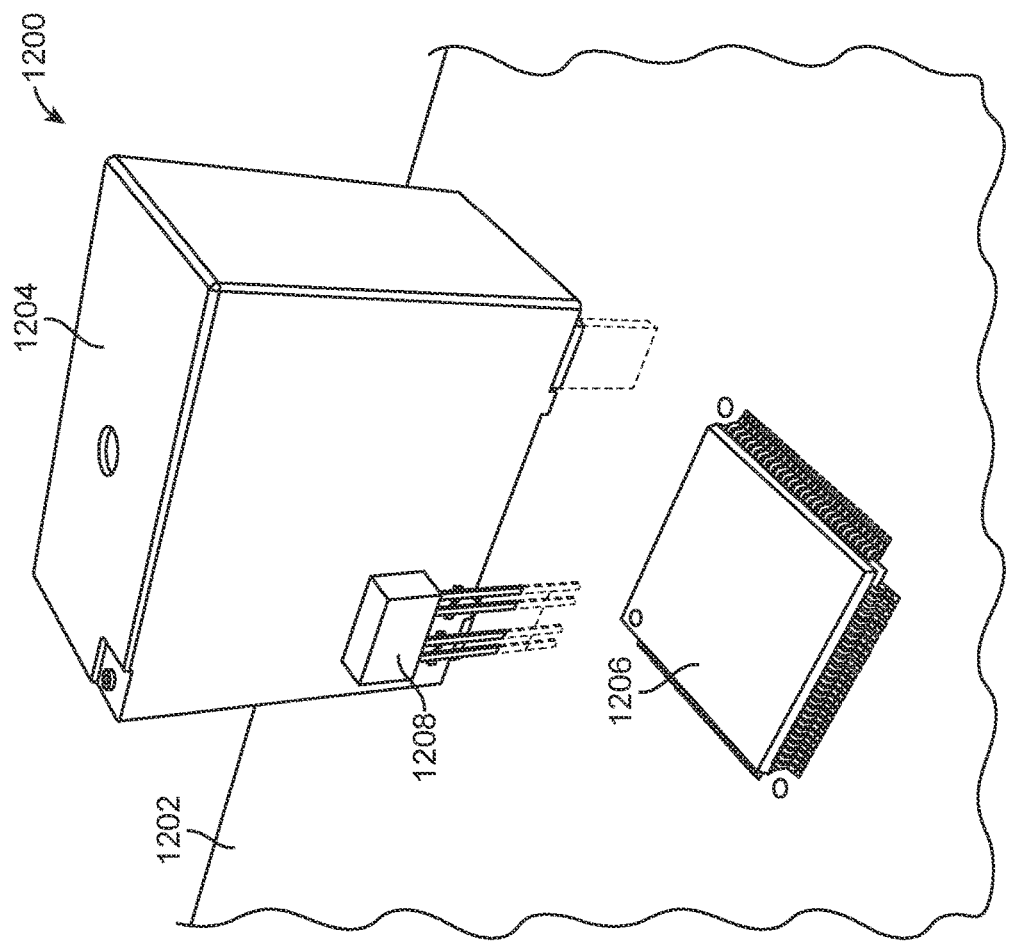
FIG. 10 depicts a perspective view of a sensor on a circuit board attached to a vertical relay, according to one embodiment.

FIG. 10 depicts a perspective view of a sensor 1208 on a circuit board 1202 attached to a vertical relay 1204, according to one embodiment. The sensor 1208, such as an optical sensor, may be mounted directly to a circuit board 1202, such as a printed circuit board (PCB). The vertical relay 1204 may be connected to the circuit board 1202 and placed next to the sensor 1208 such that the sensor 1208 is aligned relative to the vertical relay 1204 to detect a state of the vertical relay 1204. A microprocessor 1206 may also be mounted to the circuit board 1202 and in communication with the vertical relay 1204 and the sensor 1208.

It is contemplated that various combinations and/or sub-combinations of the specific features and aspects of the above embodiments may be made and still fall within the scope of the invention. Accordingly, it should be understood that various features and aspects of the disclosed embodiments may be combined with or substituted for one another in order to form varying modes of the disclosed invention. Further, it is intended that the scope of the present invention is herein disclosed by way of examples and should not be limited by the particular disclosed embodiments described above.

What is claimed is:

1. A system comprising:
   a relay, the relay comprising:
      at least one contact;
      a reflector attached to at least one contact;
   a sensor, the sensor comprising:
      an emitter configured to emit a pulse;
      a detector configured to receive a portion of the emitted pulse;
      wherein the reflector is configured to reflect at least a portion of the emitted pulse received by the detector when the at least one contact is in at least one of: an open position and a closed position.

2. The system of claim 1, wherein the relay further comprises a housing.

3. The system of claim 2, wherein the relay housing further comprises a window.

4. The system of claim 3, wherein the window is disposed proximate the reflector when the at least one contact is in at least one of: the open position and the closed position.

5. The system of claim 4, wherein the emitted pulse is received through the window and into an interior of the housing such that the emitted pulse is not received by the detector when the at least one contact is in at least one of: the open position and the closed position.

6. The system of claim 3, wherein the relay further comprises:
   an armature, wherein the at least one contact is connected to the armature.

7. The system of claim 6, wherein the relay further comprises:
   a relay coil configured to actuate the armature about a hinge connected to the armature.

8. The system of claim 7, wherein the at least one contact comprises a first contact and a second contact, wherein the first contact is connected to the armature, wherein the reflector is disposed proximate the window and the first contact is not in electrical contact with the second contact in the open position, and wherein the reflector is disposed distal the window and the first contact is in electrical contact with the second contact in the closed position.

9. The system of claim 1, wherein the relay is a normally open relay.

10. The system of claim 1, wherein the relay is a normally closed relay.

11. The system of claim 1, further comprising:
    a microcontroller in communication with the relay and the sensor.

12. The system of claim 11, wherein the microcontroller is configured to:
    send a relay signal to the relay to at least one of: switch on and switch off.

13. The system of claim 12, wherein the microcontroller is configured to:
    send a status check signal to the sensor to determine a status of the relay.

14. The system of claim 13, wherein the microcontroller is configured to:
    receive a status signal from the sensor based on the sent status check signal, wherein the status signal is based whether the detector received a portion of the emitted pulse.

15. The system of claim 14, wherein the microcontroller is configured to:
    determine whether the relay has a fault condition based on the sent relay signal and the received status signal.

16. A method comprising: emitting, by an emitter of a sensor, a pulse; and receiving at least a portion of the emitted pulse through a window in a housing of a relay; wherein at least a portion of the emitted pulse is reflected by a reflector attached to a contact of the relay and received by a detector of the sensor when the reflector is disposed proximate the window in the housing of the relay.

17. The method of claim 16, wherein at least a portion of the emitted pulse is not received by a detector of the sensor when the reflector is disposed distal from the window in the housing of the relay.

18. The method of claim 16, further comprising:
    sending, by a microcontroller, a relay signal to the relay to at least one of: switch on and switch off; and
    sending, by the microcontroller, a status check signal to the sensor.

19. The method of claim 18, further comprising:
    receiving, by the microcontroller, a status signal based on whether the portion of the reflected pulse was received by the detector of the sensor; and
    determining, by the microcontroller, whether the relay has a fault condition based on the sent relay signal and the received status signal.

20. The method of claim 16, wherein the pulse is a pulse of light, and wherein the sensor is an optical sensor.

\* \* \* \* \*